US011557965B2

(12) United States Patent
Hong

(10) Patent No.: US 11,557,965 B2
(45) Date of Patent: Jan. 17, 2023

(54) CHARGE PUMP CIRCUIT, OPERATING METHOD THEREOF AND SEMICONDUCTOR DEVICE INCLUDING CHARGE PUMP CIRCUIT

(71) Applicant: SK hynix Inc., Gyeonggi-do (KR)

(72) Inventor: Seok In Hong, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/464,526

(22) Filed: Sep. 1, 2021

(65) Prior Publication Data

US 2022/0263408 A1    Aug. 18, 2022

(30) Foreign Application Priority Data

Feb. 18, 2021    (KR) .................. 10-2021-0021981

(51) Int. Cl.
*H02M 3/07* (2006.01)
*G11C 5/14* (2006.01)

(52) U.S. Cl.
CPC .............. *H02M 3/07* (2013.01); *G11C 5/145* (2013.01)

(58) Field of Classification Search
None
See application file for complete search history.

(56) References Cited

U.S. PATENT DOCUMENTS

| 5,801,987 | A | * | 9/1998 | Dinh ..................... | G11C 5/145 365/185.23 |
| 5,999,040 | A | * | 12/1999 | Do ........................ | H02M 3/073 327/590 |
| 6,486,728 | B2 | * | 11/2002 | Kleveland ............. | H02M 3/073 327/539 |
| 6,667,928 | B2 | * | 12/2003 | Honma .................. | G11C 29/02 327/536 |
| 7,212,441 | B2 | * | 5/2007 | Yamazoe ............... | G11C 16/14 365/185.11 |

(Continued)

FOREIGN PATENT DOCUMENTS

| KR | 100132023 B1 | 4/1998 |
| KR | 101760546 B1 | 7/2017 |

OTHER PUBLICATIONS

Won, S.K., et al., High-Voltage Wordline Generator for Low-Power Program Operation in NAND Flash Memories, IEEE Asian Solid-State Circuits Conference, Nov. 14-16, 2011, pp. 169-172, Jeju, Korea.

(Continued)

*Primary Examiner* — Thomas J. Hiltunen
(74) *Attorney, Agent, or Firm* — IP & T Group LLP

(57) ABSTRACT

A semiconductor device comprises: a voltage generator suitable to pump a power source voltage to generate a first pumping voltage in response to an operation clock, a clock generator suitable to generate the operation clock having a first frequency during an initial operation period in which a level of the first pumping voltage is at a first level and to generate the operation clock having a second frequency after the initial operation period, the second frequency generated to be lower than the first frequency in response to a rise in a level of the first pumping voltage to a second level greater than the first level, and an internal circuit suitable to perform a predetermined internal operation in response to the first pumping voltage.

20 Claims, 11 Drawing Sheets

(56) References Cited

U.S. PATENT DOCUMENTS

| | | | |
|---|---|---|---|
| 8,704,587 B2* | 4/2014 | Ramanan | G11C 5/145 |
| | | | 363/59 |
| 9,520,776 B1 | 12/2016 | Reddy et al. | |
| 10,312,791 B1* | 6/2019 | Ker | H03K 3/356113 |
| 10,867,639 B2* | 12/2020 | Baek | G11C 11/5671 |
| 2006/0250177 A1* | 11/2006 | Thorp | H02M 3/073 |
| | | | 327/536 |
| 2007/0284609 A1* | 12/2007 | Ang | G11C 5/145 |
| | | | 257/139 |
| 2020/0127558 A1* | 4/2020 | Fujitsu | H03K 3/0315 |
| 2022/0165339 A1* | 5/2022 | Rana | G11C 16/30 |

OTHER PUBLICATIONS

Park, J.W., et al., A-176-Stacked-512Gb-3b/Cell 3D-NAND Flash with 11.0Gb/mm2 Density with a Peripheral Circuit Under Cell Array Architecture, 2021, International Solid-State Circuits Conference, https://underline.io/lecture/13677-30.1---a-176-stacked-512gb-3bdashcell-3d-nand-flash-with-11.0gbdashmm2-density-with-a-peripheral-circuit-under-cell-array-architecture.

\* cited by examiner

CHARGE PUMP CIRCUIT, OPERATING METHOD THEREOF AND SEMICONDUCTOR DEVICE INCLUDING CHARGE PUMP CIRCUIT

CROSS-REFERENCE TO RELATED APPLICATION(S)

The present application claims priority under 35 U.S.C. § 119(a) to Korean Patent Application No. 10-2021-0021981, filed on Feb. 18, 2021, the disclosure of which is incorporated herein by reference in its entirety.

BACKGROUND

1. Field

One or more embodiments of the present disclosure relate to a charge pump circuit, an operating method of a charge pump circuit, and a semiconductor device including a charge pump circuit.

2. Description of the Related Art

During operation of a semiconductor device (e.g., flash memory, EEPROM, DRAM), a voltage in a certain range may be used, for example, to perform a program operation and/or erase operation. This voltage may be internally to have a higher level than an external power source voltage. In order to generate such a voltage, a charge pump circuit including a plurality of pumping stages may be used. As the number of active pumping stages increases, current efficiency may decrease. This may cause input peak current to increase by a significant amount, which may limit power and performance of the semiconductor device.

SUMMARY

One or more embodiments of the present disclosure are directed to a charge pump circuit capable of effectively generating a pumping voltage.

One or more embodiments may generate the pumping voltage based on a clock signal having a frequency that varies according to the level of pumping voltage.

One or more embodiments may generate the pumping voltage in such a manner when the pumping voltage lies in a predetermined range, e.g., including but not limited to a range having a higher level of voltages than a power source voltage.

One or more embodiments may provide an operating method of such a charge pump circuit.

One or more embodiments may provide a semiconductor device including such charge pump circuit.

In accordance with an embodiment of the present invention, a charge pump circuit may include: a first charge pump suitable to generate a first pumping voltage using a power source voltage in response to an operation clock, the first charge pump including N pumping stages configured to operate based on N first pump control signals, respectively, where N is a natural number equal to or greater than 2; a first pump control signal generator suitable to activate a first number of signals among the N first pump control signals to raise the first pumping voltage to a level higher than a level of the power source voltage by a first amount, and to activate a second number of signals among the N first pump control signals to raise the level of the first pumping voltage to be higher than the level of the power source voltage by a second amount, the first number of signals being greater than the second number of signals and the first amount being greater than the second amount; and a clock generator suitable to change a frequency of the operation clock based on whether the number of activated signals corresponds to the first number of signals or the second number of signals, the clock generator suitable to: generate the operation clock having a first frequency based on activation of the first number of signals, and generate the operation clock having a second frequency based on activation of the second number of signals, wherein the second frequency is higher than the first frequency.

The first charge pump may include: a second pump control signal generator suitable to generate N second pump control signals having a same activation period as the N first pump control signals but having higher activation levels than the N first pump control signals; and N power source supplies suitable to supply the power source voltage as operating power of the N pumping stages in response to the N second pump control signals, respectively.

The second pump control signal generator may include: a second charge pump suitable to pump the power source voltage to generate a second pumping voltage in response to the operation clock; and N shifters suitable to level-shift activation levels of the N first pump control signals to a level of the second pumping voltage, and to output the level-shifted N first pump control signals as the N second pump control signals.

The N power source may comprise N NMOS transistors suitable to selectively supply the power source voltage to respective ones of the N pumping stages in response to respective ones of the N second pump control signals.

The first pump control signal generator may activate the N first pump control signals in a predetermined order, and may deactivate the N first pump control signals in a reverse order of the predetermined order.

The charge pump circuit may further include: a voltage comparator suitable to compare the level of the first pumping voltage with a pumping reference voltage level and to generate an operation control signal. The first charge pump may include a pumping controller suitable to on-off control an operation of each of the N pumping stages in response to at least one of the N first pump control signals, the operation clock, or the operation control signal.

The clock generator may include: a driving operator suitable to increase or decrease a level of a driving operation voltage in response to a feedback signal, and to adjust a speed at which the level of the driving operation voltage decreases, depending on activation of the first number or the second number of signals among the N first pump control signals; a feedback signal generator suitable to compare the level of the driving operation voltage with a driving reference voltage level, and to determine whether to activate the feedback signal according to a result of the comparison result; and a clock output suitable to output the feedback signal as the operation clock. The driving operator suitable to: decrease a speed at which the level of the driving operation voltage decreases when the number of activated signals among the N first pump control signals is increases, and increase the speed at which the level of the driving operation voltage decreases when the number of activated signals among the N first pump control signals decreases.

In accordance with an embodiment of the present invention, a semiconductor device may include: a voltage generator suitable to pump a power source voltage to generate a first pumping voltage in response to an operation clock; a clock generator suitable to generate the operation clock having a first frequency during an initial operation period in which a level of the first pumping voltage is at a first level and to generate the operation clock having a second frequency after the initial operation period, the second frequency generated to be lower than the first frequency in response to a rise in a level of the first pumping voltage to a second level greater than the first level; and an internal circuit suitable to perform a predetermined internal operation in response to the first pumping voltage.

The clock generator may include: a first pump control signal generator suitable to activate a first number of signals among N first pump control signals to raise the level of the first pumping voltage to be higher than a level of the power source voltage by a first amount, and to activate a second number of signals among the N first pump control signals to raise the level of the first pumping voltage to be higher than the level of the power source voltage by a second amount, the first number of signals greater than the second number of signals and the first amount greater than the second amount; and a clock generator suitable to reduce the frequency of the operation clock as the number of activated signals among the N first pump control signals increases, and to increase the frequency of the operation clock as the number of activated signals among the N first pump control signals decreases, where N is a natural number equal to or greater than 2.

The voltage generator may include: a first charge pump suitable to generate a first pumping voltage using the power source voltage in response to the operation clock, the first charge pump including N pumping stages which are activated in response to N first pump control signals, respectively.

The first charge pump may include: a second pump control signal generator suitable to generate N second pump control signals having a same activation period as the N first pump control signals but having higher activation levels than the N first pump control signals; and N power source supplies suitable to supply the power source voltage as operating power of the N pumping stages in response to the N second pump control signals, respectively.

The second pump control signal generator may include: a second charge pump suitable to pump the power source voltage to generate a second pumping voltage in response to the operation clock; and N shifters suitable to level-shift activation levels of the N first pump control signals to a level of the second pumping voltage, and to output the level-shifted N first pump control signals as the N second pump control signals.

The N power source supplies may include N NMOS transistors suitable to selectively supply the power source voltage to respective ones of the N pumping stages in response to respective ones of the N second pump control signals.

The first pump control signal generator: may activate the N first pump control signals in a predetermined order, and may deactivate the N first pump control signals in a reverse order of the predetermined order.

The voltage generator may include: a voltage comparator suitable to compare the level of the first pumping voltage with a pumping reference voltage level and to generate an operation control signal, the first charge pump block comprising a pumping controller suitable to on-off control an operation of each of the N pumping stages in response to at least one of the N first pump control signals, the operation clock or the operation control signal.

The clock generator may include: a driving operator suitable to increase or decrease a level of a driving operation voltage in response to a feedback signal, and adjust a speed at which the level of the driving operation voltage decreases depending on the number of activated signals among the N first pump control signals; a feedback signal generator suitable to compare the level of the driving operation voltage with a driving reference voltage level and to determine whether to activate the feedback signal according to a result of the comparison; and a clock output suitable to output the feedback signal as the operation clock. The driving operator may decrease the speed at which the level of the driving operation voltage decreases when the number of activated signals among the N first pump control signals is in a first range, and may increase the speed at which the level of the driving operation voltage when the number of activated signals among the N first pump control signals is in a second range less than the first range.

In accordance with an embodiment of the present invention, an operating method of a charge pump circuit that generates a first pumping voltage using a power source voltage in response to an operation clock, the charge pump circuit including N pumping stages having operations determined in response to respective ones of N first pump control signals, wherein N is a natural number equal to or greater than 2, the operating method may include: activating a first number of signals among the N first pump control signals to raise a level of the first pumping voltage to be higher than a level of the power source voltage by a first amount, and activating a second number of signals among the N first pump control signals to raise the level of the first pumping voltage to be higher than the level of the power source voltage by a second amount, the first number of signals being greater than the second number of signals and the first amount being greater than the second amount; and generating the operation clock having a first frequency based on activation of the first number of signals, and generating the operation clock having a second frequency based on activation of the second number of signals, wherein the first frequency is lower than the second frequency.

The operating method may further include: generating N second pump control signals having a same activation period as the N first pump control signals and having higher activation levels than the N first pump control signals; and supplying the power source voltage as operating power of the N pumping stages in response to the N second pump control signals, respectively.

Generating the N second pump control signals may include:

pumping the power source voltage to generate a second pumping voltage in response to the operation clock; and level-shifting activation levels of the N first pump control signals to a level of the second pumping voltage, and output the level-shifted N first pump control signals as the N second pump control signals.

The N first pump control signals may be activated in a predetermined order and deactivated in a reverse order of the predetermined order.

In accordance with an embodiment of the present invention, an apparatus may include: a storage area configured to store instructions; and one or more processors which, when the instructions are executed, may be configured to: control generation of different combinations of control signals to selectively activate different combinations of pumping stages of a charge pump circuit based on an operation clock; and output a pumping voltage based on one of the different combinations of control signals, wherein the instructions, when executed, cause the one or more processors to: set the operation clock to a first frequency based on activation of a first number of the control signals, and set the operation clock to have a second frequency based on activation of the second number of the control signals, wherein the second frequency is higher than the first frequency.

The instructions, when executed, cause the one or more processors to: activate a first number of signals to raise the first pumping voltage to a level higher than a level of the power source voltage by a first amount, activate a second number of signals to raise the level of the first pumping voltage to be higher than the level of the power source voltage by a second amount, the first number of signals being greater than the second number of signals and the first amount being greater than the second amount.

In accordance with an embodiment of the present invention, a charge pump circuit may include: a charge pump suitable to generate a pumping voltage using a power source voltage in response to an operation clock, the charge pump including pumping stages suitable to operate based on pump control signals, respectively; a first pump control signal generator suitable to selectively activate the pump control signals corresponding to a target level of the pumping voltage; and a clock generator suitable to change a frequency of the operation clock based on a number of the activated pump control signals.

The clock generator suitable to: generate the operation clock having a first frequency based on activation of a first number of signals among the pump control signals, and generate the operation clock having a second frequency based on activation of a second number of signals among the pump control signals. The first number may be greater than the second number, and the second frequency may be higher than the first frequency.

In accordance with an embodiment of the present invention, a method of operating a semiconductor device, the method may include: generating a first pumping voltage using a power source voltage in response to an operation clock; generating the operation clock having a first frequency during an initial pumping period; generating the operation clock having a second frequency during a pumping period after the initial pumping period, the second frequency being lower than the first frequency and corresponding to a level of the first pumping voltage; and performing a predetermined internal operation using the first pumping voltage.

These technical problems obtainable in the present disclosure are not limited to the embodiments described above, and other technical problems not described herein will be apparently understood by those skilled in the art, to which the present disclosure pertains, from the following description.

DETAILED DESCRIPTION

Figure 1:
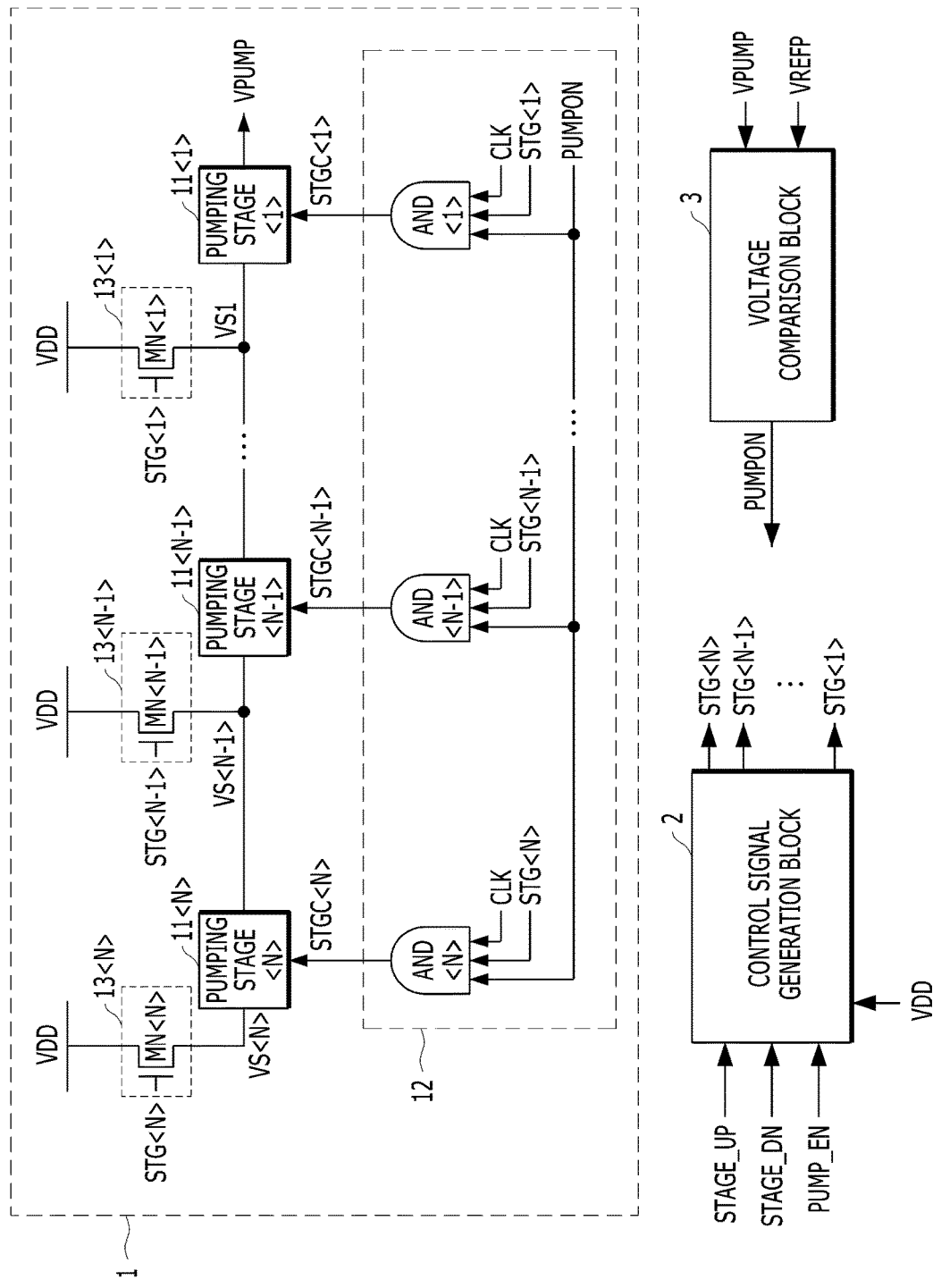
FIG. 1 illustrates an embodiment of a charge pump circuit.

Various examples of the disclosure are described below in more detail with reference to the accompanying drawings. Aspects and features of the present invention, however, may be embodied in different ways to form other embodiments, including variations of any of the disclosed embodiments. Thus, the invention is not limited to the embodiments set forth herein. Rather, the described embodiments are provided so that this disclosure is thorough and complete, and fully conveys the disclosure to those skilled in the art to which the invention pertains. Throughout the disclosure, like reference numerals refer to like parts throughout the various figures and examples of the disclosure. It is noted that reference to "an embodiment," "another embodiment" or the like does not necessarily mean only one embodiment, and different references to any such phrase are not necessarily to the same embodiment(s).

It will be understood that, although the terms "first", "second", "third", and so on may be used herein to identify various elements, these elements are not limited by these terms. These terms are used to distinguish one element from another element that otherwise have the same or similar names. Thus, a first element in one instance could be termed a second or third element in another instance without indicating any change in the element itself.

The drawings are not necessarily to scale and, in some instances, proportions may be exaggerated in order to clearly illustrate features of the embodiments. When an element is referred to as being connected or coupled to another element, it should be understood that the former can be directly connected or coupled to the latter, or electrically connected or coupled to the latter via one or more intervening elements therebetween. In addition, it will also be understood that when an element is referred to as being "between" two elements, it may be the only element between the two elements, or one or more intervening elements may also be present.

The terminology used herein is for the purpose of describing particular embodiments only and is not intended to limit the invention. As used herein, singular forms are intended to include the plural forms and vice versa, unless the context clearly indicates otherwise. Similarly, the indefinite articles "a" and "an" mean one or more, unless it is clear from the language or context that only one is intended.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the invention pertains in view of the disclosure. It will be further understood that terms, such as those defined in commonly used dictionaries, should be interpreted as having a meaning that is consistent with their meaning in the context of the disclosure and the relevant art, and not be interpreted in an idealized or overly formal sense unless expressly so defined herein.

In the following description, numerous specific details are set forth in order to provide a thorough understanding of the invention. The invention may be practiced without some or all of these specific details. In other instances, well-known process structures and/or processes have not been described in detail in order not to unnecessarily obscure the invention.

It is also noted, that in some instances, as would be apparent to those skilled in the relevant art, a feature or element described in connection with one embodiment may be used singly or in combination with other features or elements of another embodiment, unless otherwise specifically indicated.

Embodiments of the disclosure are described in detail below with reference to the accompanying drawings, wherein like numbers reference like elements.

FIG. 1 is a diagram illustrating an embodiment of a charge pump circuit including N pumping stages 11<1:N>, where N is 2 or more. The charge pump circuit may use a relatively small number of pumping stages among the N pumping stages 11<1:N> when generating a pumping voltage VPUMP having a slightly higher level (e.g., in a first range) than a power source voltage VDD. When generating the pumping voltage VPUMP having a much higher level (e.g., in a second range) than the power source voltage VDD, the charge pump circuit may use a relatively large number of pumping stages among the N pumping stages 11<1:N>.

When a target level of the pumping voltage VPUMP to be generated is relatively low (e.g., below a predetermined level), the charge pump circuit according to the present embodiment may operate a relatively small number of the N pumping stages 11<1:N>. As a result, the charge pump circuit may have relatively low drivability and relatively high efficiency. The greater the number N, and/or the greater the number of the N pumping stages 11<1:N> that are operating, the drivability of the charge pump circuit may increase, but the efficiency of operation of the charge pump circuit may decrease in terms of its ability to generate the target level of the pumping voltage VPUMP.

Referring to FIG. 1, the charge pump circuit may include a charge pump block 1 including the N pumping stages 11<1:N>, a control signal generation block (or control signal generator) 2, and a voltage comparison block (or a voltage comparator) 3. In addition, the charge pump block 1 may include a pumping control unit (or pumping controller) 12 and N power source supply units 13<1:N>.

The charge pump block 1 may generate the pumping voltage VPUMP by pumping the power source voltage VDD in response to an operation clock CLK. For example, the pumping control unit 12 may generate N toggling control signals STGC<1:N> in response to the operation clock CLK, N pump control signals STG<1:N>, and an operation control signal PUMPON. The pumping control unit 12 may include N AND gates AND<1:N>, each of which receives a corresponding one of the N pump control signals STG<1:N>, the operation control signal PUMPON and the operation clock CLK to generate a corresponding one of N toggling control signals STGC<1:N>.

For example, when the operation clock CLK toggles while a first signal STG<1> of the N pump control signals STG<1:N> and the operation control signal PUMPON are activated, a first signal STGC<1> of the N toggling control signals STGC<1:N> may be regarded as being in an enable state. In one example, when any one of a second signal STG<2> of the N pump control signals STG<1:N> and the operation control signal PUMPON is deactivated, a second signal STGC<2> of the N toggling control signals STGC<1:N> may be regarded as being in a disable state.

Figure 8:
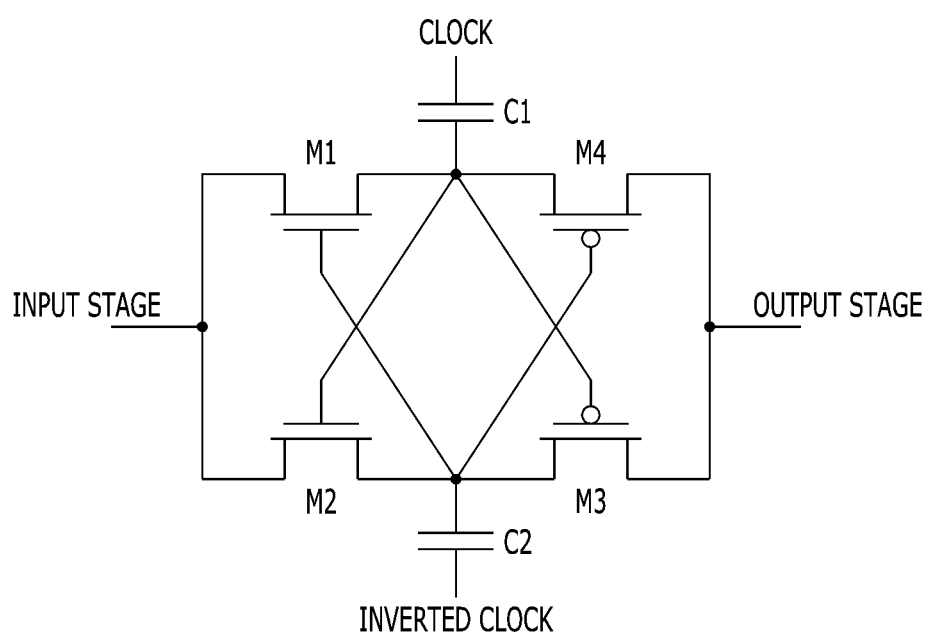
FIG. 8 illustrates an embodiment of a pumping stage.

Whether or not the N pumping stages 11<1:N> operate may be selected in response to the N toggling control signals STGC<1:N>, respectively. For example, a pumping stage which corresponds to a toggling control signal in the enable state may operate, and a pumping stage which corresponds to a toggling control signal in the disable state may not operate. As the number of pumping stages operating among the N pumping stages 11<1:N> increases, the level of the pumping voltage VPUMP may increase to be much higher (e.g., e.g., by a first predetermined amount) than the level of the power source voltage VDD. Conversely, as the number of pumping stages operating decreases, the level of the pumping voltage VPUMP may increase to be slightly higher (e.g., e.g., by a first predetermined amount lower than the first predetermined amount) than the level of the power source voltage VDD. An embodiment of each of the N pumping stages 11<1:N> is described with reference to FIG. 8.

Each of the N pumping stages 11<1:N> may operate according to a pair of complementary clocks having an inverted phase. For example, each of the N pumping stages 11<1:N> may generate a voltage of an output stage by pumping a voltage of an input stage according to operation clock signal CLK and an inverted clock signal CLKB of the operation clock signal CLK. In this case, the operation clock CLK and the inverted clock CLKB may have an inverted phase and the same period.

In one embodiment, each of the N pumping stages 11<1:N> may include first to fourth transistors M1 to M4 and first and second capacitors C1 and C2. The first transistor M1 may be coupled between the input stage and the other stage of the first capacitor C1, and may have a gate receiving the inverted clock CLKB transmitted through the second capacitor C2. The second transistor M2 may be coupled between the input stage and the other stage of the second capacitor C2, and have a gate receiving the operation clock CLK transmitted through the first capacitor C1. The third transistor M3 may be coupled between the other stage of the first capacitor C1 and the output stage, and may have a gate receiving the inverted clock CLKB transmitted through the second capacitor C2. The fourth transistor M4 may be coupled between the other stage of the second capacitor C2 and the output stage, and may have a gate receiving the operation clock CLK transmitted through the first capacitor C1. The first and second transistors M1 and M2 may be configured as NMOS transistors, and the third and fourth transistors M3 and M4 may be configured as PMOS transistors. The transistors may have a different combination of conductivities in another embodiment.

The N power source supply units 13<1:N> may supply the power source voltage VDD as N supply voltages VS<1:N> to the N pumping stages 11<1:N> in response to the N pump control signals STG<1:N>, respectively. In one embodiment, the N power source supply units 13<1:N> may include N NMOS transistors MN<1:N>, respectively. The N NMOS transistors may have drains coupled to the supply power source voltage VDD and may output through their sources the N supply voltages VS<1:N> to the N pumping stages 11<1:N>, in response to the N pump control signals STG<1:N> input to respective ones of their gates.

The control signal generation block 2 may generate the N pump control signals STG<1:N> in response to operation signals STAGE_UP, STAGE_DN and PUMP_EN. For example, while the pump operation signal PUMP_UP is activated, the control signal generation block 2 may increase the number of control signals (which are activated among the N pump control signals STG<1:N>) in response to the up operation signal STAGE_UP being toggled. While the pump operation signal PUMP_UP is activated, the control signal generation block 2 may decrease the number of control signals, which are activated among the N pump control signals STG<1:N>, in response to the down operation signal STAGE_DN being toggled. When the pump operation signal PUMP_UP is deactivated, the control signal generation block 2 may deactivate all of the N pump control signals STG<1:N>.

In one embodiment, the operation signals STAGE_UP, STAGE_DN and PUMP_EN may be signals input from a source outside of the charge pump circuit. For example, assuming that the charge pump circuit is included in a semiconductor device, the operation signals STAGE_UP, STAGE_DN and PUMP_EN may be generated by a mode register set (MRS) in the semiconductor device.

The control signal generation block 2 may activate a relatively large number of signals (e.g., greater than a predetermined number) among the N pump control signals STG<1:N> in order to raise the level of the pumping voltage VPUMP to be much higher than the level of the power source voltage VDD. In addition, the control signal generation block 2 may activate a relatively small number of signals among the N pump control signals STG<1:N> in order to raise the level of the pumping voltage VPUMP to be slightly higher than the level of the power source voltage VDD.

The voltage comparison block 3 may compare the level of the pumping voltage VPUMP generated by the charge pump block 1 with a pumping reference voltage level VREFP and generate the operation control signal PUMPON. For example, the voltage comparison block 3 may enable the operation control signal PUMPON when the level of the pumping voltage VPUMP generated by the charge pump block 1 is lower than pumping reference voltage level VREFP. The voltage comparison block 3 may disable the operation control signal PUMPON when the level of the pumping voltage VPUMP generated by the charge pump block 1 is higher than pumping reference voltage level VREFP. The pumping reference voltage level VREFP may be set, for example, in a bandgap circuit capable of maintaining a target level regardless of variations in process, voltage and temperature (PVT).

Figure 2A:
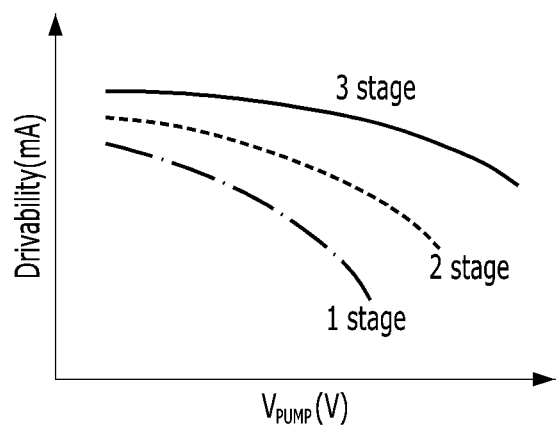
FIGS. 2A to 2C illustrate examples of the operation of the charge pump circuit of FIG. 1.
Figure 2B:
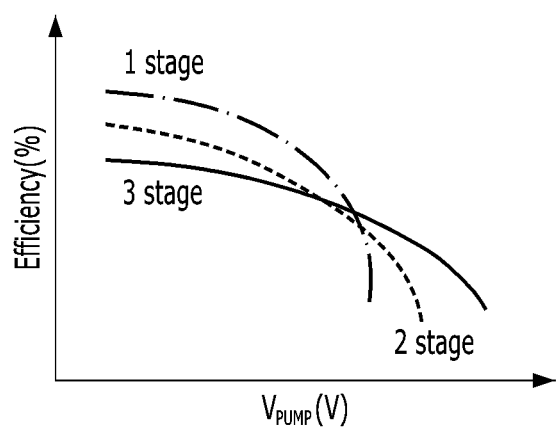
Figure 2C:
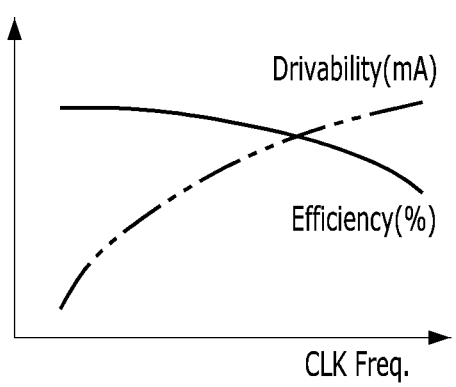

FIGS. 2A to 2C are diagrams illustrating example of the operation of the charge pump circuit illustrated in FIG. 1.

Referring FIG. 2A, it may be seen how drivability varies depending on the level of the pumping voltage VPUMP generated by the charge pump circuit and the number of pumping stages that are used (e.g., active or in operation), among the N pumping stages 11<1:N> in the charge pump block 1.

For example, when one pumping stage of the N pumping stages 11<1:N> is used (1 stage), the pumping voltage VPUMP having the same level is generated even when relatively lower drivability is used than when two pumping stages thereof are used (2 stage). When two pumping stages of the N pumping stages 11<1:N> are used (2 stage), the pumping voltage VPUMP having the same level is generated even when relatively low drivability is used compared to when three pumping stages thereof are used (3 stage).

Referring to FIG. 2B, it may be seen how efficiency may vary depending on the level of the pumping voltage VPUMP generated by the charge pump circuit and the number of pumping stages used among the N pumping stages 11<1:N>.

For example, when the level of the pumping voltage VPUMP is relatively low, two pumping stages of the N pumping stages 11<1:N> that are used (2 stage) may have higher efficiency than a case where three pumping stages are used (3 stage). Also, a case where one pumping stage is used (1 stage) may have higher efficiency than a case where two pumping stages thereof are used (2 stage).

However, as the level of the pumping voltage VPUMP increases, efficiency may decrease more rapidly when one pumping stage of the N pumping stages 11<1:N> is used (1 stage) than when two pumping stages are used (2 stage). Also, efficiency may decrease more rapidly when two pumping stages are used (2 stage) than when three pumping stages are used (3 stage).

Referring to FIGS. 2A and 2B, the level to which the pumping voltage VPUMP can be raised is lower when one pumping stage of the N pumping stages 11<1:N> is used (1 stage) than when two pumping stages are used (2 stage). In addition, the level to which the pumping voltage VPUMP can be raised is lower when two pumping stages of the N pumping stages 11<1:N> are used (2 stage) than when three pumping stages are used (3 stage). In other words, it may not be possible to reach a target level of the pumping voltage VPUMP when the number of activated or used pumping stages is small. Thus, the higher the target level of the pumping voltage VPUMP, the greater the number of pumping stages used. However, in some cases, it may be desirable to reduce the number of pumping stages used when the target level of the pumping voltage VPUMP is relatively low.

Accordingly, when generating the pumping voltage VPUMP having a level slightly higher (e.g., by a first amount) than the level of the power source voltage VDD, the charge pump circuit illustrated in FIG. 1 may operate using a relatively small number of the N pumping stages 11<1:N>. When generating the pumping voltage VPUMP having a level much higher (e.g., by a second amount greater than the first amount) than the level of the power source voltage VDD, the charge pump circuit may operate using a relatively large number of the N pumping stages 11<1:N>.

Referring to FIG. 2C, an example is shown of how drivability and efficiency of the charge pump circuit illustrated in FIG. 1 may vary depending on the frequency of operation clock CLK. Here, it may be seen that, since relatively low drivability is used when the frequency of the operation clock CLK is relatively low, the target pumping voltage VPUMP is generated by the charge pump circuit with relatively high efficiency. In one embodiment, the low frequency of the operation clock CLK may represent that generating the pumping voltage VPUMP takes a relatively large amount of time.

However, as the frequency of the operation clock CLK increases, the drivability used to generate the target pumping voltage VPUMP increases, and accordingly efficiency decreases. In one embodiment, a high frequency of the operation clock CLK may represent that generation of the pumping voltage VPUMP takes relatively less time. The terms high frequency and low frequency may be predetermined frequencies determined relative to one another and/or based on the intended application.

Figure 3:
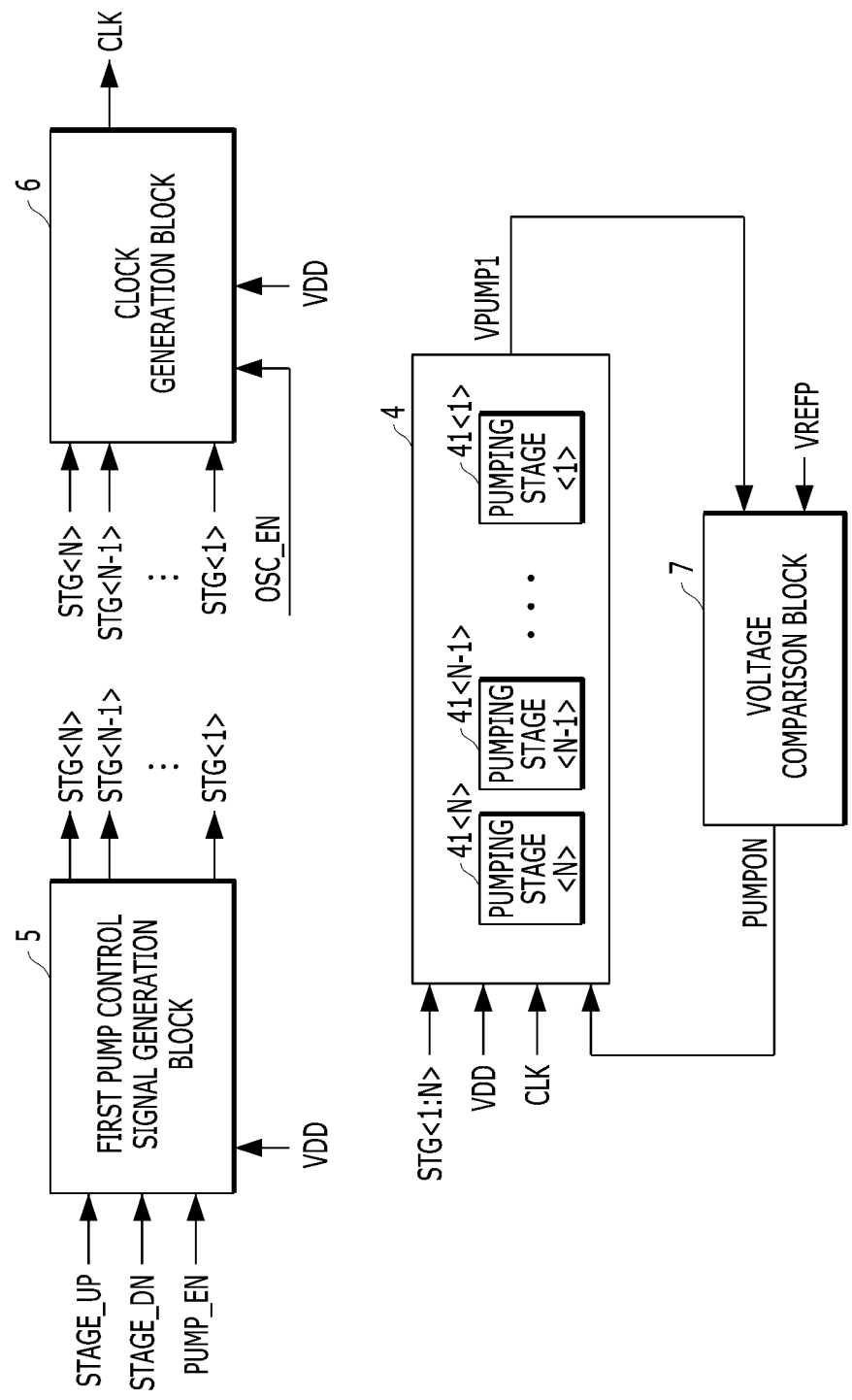
FIG. 3 illustrating an embodiment of a charge pump circuit.
Figure 4:
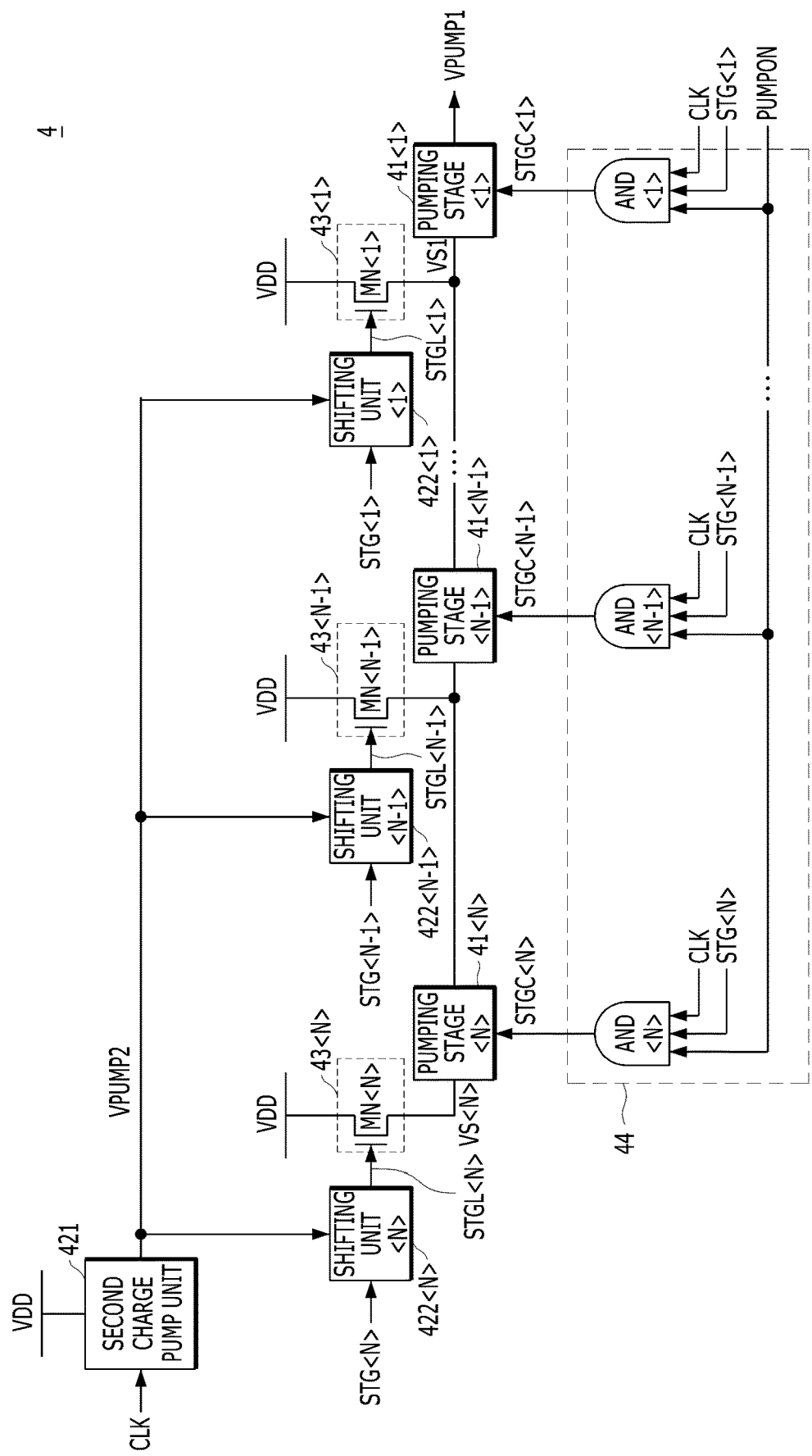
FIG. 4 illustrates an embodiment of a first charge pump block.
Figure 5:
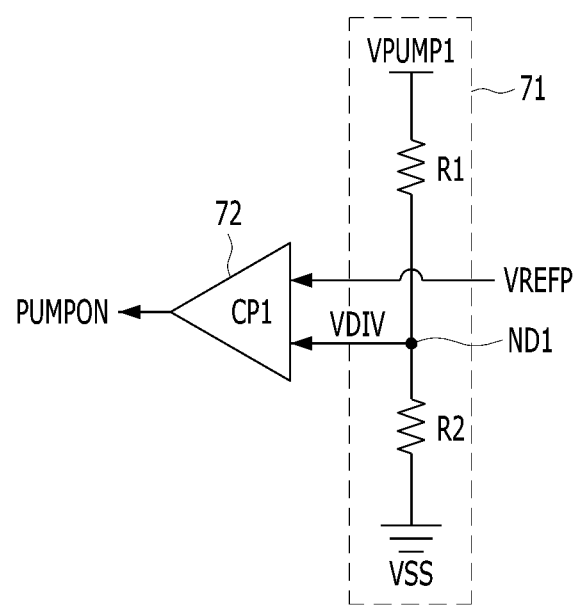
FIG. 5 illustrates an embodiment of a voltage comparison block.

FIG. 3 is a diagram illustrating an embodiment of a charge pump circuit, and FIG. 4 is a diagram illustrating an embodiment of a first charge pump block of the charge pump circuit illustrated in FIG. 3. FIG. 5 is a diagram illustrating an embodiment of a voltage comparison block (or comparator) of the charge pump circuit illustrated in FIG. 3.

Referring to FIG. 3, the charge pump circuit includes N pumping stages 41<1:N>. When generating a first pumping voltage VPUMP1 having a level slightly higher (e.g., by a first amount) than the level of the power source voltage VDD, the charge pump circuit may use a relatively small number of the N pumping stages 41<1:N> and may operate the relatively small number of pumping stages in response to the operation clock CLK having a relatively high frequency. In addition, when generating the first pumping voltage VPUMP1 having a level much higher than the level of the power source voltage VDD (e.g., by a second amount greater than the first amount), the charge pump circuit may use a relatively large number of the N pumping stages 41<1:N>, and may operate the relatively large number of pumping stages in response to the operation clock CLK having a relatively low frequency. The first and second amounts may be predetermined amounts determined, for example, based on the intended application.

Accordingly, when a target level of the first pumping voltage VPUMP1 to be generated is relatively low, according to the present embodiment the charge pump circuit may operate a relatively small number of the N pumping stages 41<1:N>, and thus may have relatively low drivability and relatively high efficiency. However, at the same time, the charge pump circuit may use the operation clock CLK having a relatively high frequency, and thus may have relatively high drivability, relatively low efficiency, and a relatively high driving speed. The decrease in drivability and increase in efficiency achieved by operating a relatively small number of the N pumping stages 41<1:N> may, in some cases, be almost similar to the increase in drivability and decrease in efficiency achieved using a relatively high frequency. Thus, the two effects may be offset. However, the effect of increasing driving speed due to the relatively high frequency may remain unchanged.

In addition, when the target level of the first pumping voltage VPUMP1 to be generated is relatively high, according to the present embodiment the charge pump circuit may operate a relatively large number of the N pumping stages 41<1:N>, and thus may have relatively high drivability and relatively low efficiency. However, at the same time, the charge pump circuit may use the operation clock CLK having a relatively low frequency and thus may have relatively low drivability, relatively high efficiency and a relatively low driving speed. The increase in drivability and decrease in efficiency by operating a relatively large number of the N pumping stages 41<1:N> may, in some cases, be almost similar to the decrease in drivability and increase in efficiency using a relatively low frequency. Thus, the two effects may be offset.

The driving speed may decrease due to use of the relatively low frequency, but the target level of the first pumping voltage VPUMP1 may be limited to a relatively high period. Thus, the degree to which the decrease in driving speed influences overall performance of the charge pump circuit may be reduced or minimized. Here, "N" may be a natural number equal to or greater than 2.

Referring to FIG. 3, the charge pump circuit may include a first charge pump block 4 including the N pumping stages 41<1:N>, a first pump control signal generation block 5, a clock generation block 6 and a voltage comparison block 7.

The first charge pump block 4 may pump the power source voltage VDD in response to the operation clock CLK, and may generate the first pumping voltage VPUMP1. Whether or not the N pumping stages 41<1:N> operate (or are active) may be selected in response to N first pump control signals STG<1:N>, respectively.

The first pump control signal generation block 5 may activate a relatively large number of the N first pump control signals STG<1:N>, in order to raise the level of the first pumping voltage VPUMP1 to be much higher than the level of the power source voltage VDD. The first pump control signal generation block 5 may activate a relatively small number of the N first pump control signals STG<1:N>, in order to raise the level of the first pumping voltage VPUMP1 to be slightly higher than the level of the power source voltage VDD.

In addition, the first pump control signal generation block 5 may activate the N first pump control signals STG<1:N> in a predetermined order, and may deactivate the N first pump control signals STG<1:N> in a reverse order of the predetermined order. For example, the first pump control signal generation block 5 may operate each of the N pumping stages 41<1:N> in the order of operating a first pumping stage 41<1> among the N pumping stages 41<1:N> and then operating a second pumping stage 41<2>. In this case, the first pump control signal generation block 5 may activate each of the N first pump control signals STG<1:N> in an order of activation of a first pump control signal STG<1> among the N first pump control signals STG<1:N> and then activating a second first pump control signal STG<2>. The first pump control signal generation block 5 may deactivate each of the N pump control signals STG<1:N> in a reverse order of the activation order.

The clock generation block 6 may change the frequency of the operation clock CLK according to the number of activated signals among the N first pump control signals STG<1:N> generated by the first pump control signal generation block 5. For example, the clock generation block 6 may generate the operation clock CLK to have a relatively low frequency as the number of activated signals among the N first pump control signals STG<1:N> is relatively large. The clock generation block 6 may generate the operation clock CLK having a relatively high frequency as the number of activated signals among the N first pump control signals STG<1:N> is relatively small. The clock generation block 6 may generate (e.g., toggle) the operation clock CLK in response to a clock generation signal OCS_EN being enabled. At this time, the clock generation signal OCS_EN may be input from a source outside the charge pump circuit. For example, assuming that the charge pump circuit is in a semiconductor device, the clock generation signal OCS_EN may be generated by a mode register set (MRS) in the semiconductor device.

The voltage comparison block 7 may compare the level of the first pumping voltage VPUMP1 (generated by the first charge pump block 4) with a pumping reference voltage level VREFP and may generate an operation control signal PUMPON. For example, the voltage comparison block 7 may enable the operation control signal PUMPON when the level of the first pumping voltage VPUMP1 is lower than the pumping reference voltage level VREFP. The voltage comparison block 7 may disable the operation control signal PUMPON when the level of the first pumping voltage VPUMP1 is higher than the pumping reference voltage level VREFP. The pumping reference voltage level VREFP may be set, for example, in a bandgap circuit that can maintain a target level regardless of variations in process, voltage and temperature (PVT). The bandgap circuit may, for example, be outside the charge pump circuit, e.g., assuming the charge pump circuit is in a semiconductor device, the bandgap circuit may be one of the components in the semiconductor device.

Referring to FIGS. 3 and 4, the first charge pump block 4 may include the N pumping stages 41<1:N>, a second pump control signal generation unit (or generator) 421 and 422<1:N>, N power source supply units 43<1:N> and a pumping control unit (or controller) 44. In addition, the second pump control signal generation unit 421 and 422<1:N> may include a second charge pump unit 421 and N shifting units 422<1:N>.

The pumping control unit 44 may generate N toggling control signals STGC<1:N> in response to the operation clock CLK, the N first pump control signals STG<1:N> and the operation control signal PUMPON. The pumping control unit 44 may include N AND gates AND<1:N>, each of which receives a corresponding one of the N first pump control signals STG<1:N>, the operation control signal PUMPON and the operation clock CLK and generates a corresponding one of the N toggling control signals STGC<1:N>. For example, when the operation clock CLK toggles while the operation control signal PUMPON is enabled and the first signal STG<1> of the N first pump control signals STG<1:N> is activated, a first signal STGC<1> of the N toggling control signals STGC<1:N> may be in an enable state. The enabled first signal STGC<1> may toggle at the same frequency as the frequency at which the operation clock CLK toggles.

In one embodiment, when the operation control signal PUMPON is enabled and the second signal STG<2> of the N first pump control signals STG<1:N> is deactivated, a second signal STGC<2> of the N toggling control signals STGC<1:N> may be regarded as in a disable state, regardless of whether the operation clock CLK toggles.

In one embodiment, when the operation control signal PUMPON is disabled, all the N toggling control signals STGC<1:N> may be regarded as in a disable state, regardless of whether each of the N first pump control signals STG<1:N> is activated and whether the operation clock CLK toggles.

Whether or not the N pumping stages 41<1:N> operate may be selected in response to the N toggling control signals STGC<1:N>, respectively. For example, a pumping stage corresponding to a signal in an enable state (among the N toggling control signals STGC<1:N>) may operate and a pumping stage corresponding to a signal in a disabled signal (among the N toggling control signals STGC<1:N>) may not operate. As the number of operating pumping stages among the N pumping stages 41<1:N> increases, the level of the first pumping voltage VPUMP1 may be raised to be much higher than the level of the power source voltage VDD. Conversely, as the number of operating pumping stages among the N pumping stages 41<1:N> decreases, the level of the first pumping voltage VPUMP1 may be raised to be slightly higher than the level of the power source voltage VDD. An embodiment of each of the N pumping stages 41<1:N> is described in reference to FIG. 8.

Each of the N pumping stages 41<1:N> may operate according to a pair of complementary clocks having an inverted phase. For example, each of the N pumping stages 41<1:N> may generate a voltage of an output stage by pumping a voltage of an input stage according to the operation clock CLK and an inverted clock CLKB of the operation clock CLK. In this case, the operation clock CLK and the inverted clock CLKB may have inverted phases and the same period.

For example, each of the N pumping stages 41<1:N> may include first to fourth transistors M1 to M4 and first and second capacitors C1 and C2. The first transistor M1 may be coupled between the input stage and the other stage of the first capacitor C1, and may have a gate receiving the inverted clock CLKB transmitted through the second capacitor C2. The second transistor M2 may be coupled between the input stage and the other stage of the second capacitor C2, and may have a gate receiving the operation clock CLK transmitted through the first capacitor C1. The third transistor M3 may be coupled between the other stage of the first capacitor C1 and the output stage, and may have a gate receiving the inverted clock CLKB transmitted through the second capacitor C2. The fourth transistor M4 may be coupled between the other stage of the second capacitor C2 and the output stage, and may have a gate receiving the operation clock CLK transmitted through the first capacitor C1. In one embodiment, the first and second transistors M1 and M2 may be configured as NMOS transistors, and the third and fourth transistors M3 and M4 may be configured as PMOS transistors. These transistors may have different conductivities in another embodiment.

The second pump control signal generation unit 421 and 422<1:N> may have the same activation period as the N first pump control signals STG<1:N>, and may generate N second pump control signals STGL<1:N> having relatively higher activation levels than the N first pump control signals STG<1:N>. For example, when the N first pump control signals STG<1:N> have an activation period that corresponds to a level of the power source voltage VDD, the N second pump control signals STGL<1:N> have an activation period that corresponds to a level higher than the level of the power source voltage VDD.

The second charge pump unit 421 in the second pump control signal generation unit 421 and 422<1:N> may pump the power source voltage VDD in response to the operation clock CLK, and may generate a second pumping voltage VPUMP2. In this case, the second charge pump unit 421 may not have a shape including a plurality of pumping stages 41<1:N> like the first charge pump block 4, e.g., the second charge pump unit 421 may include only one pumping stage. In addition, the second pumping voltage VPUMP2 may be input from an external device. In this case, the second charge pump unit 421 may be excluded from second pump control signal generation unit 421 and 422<1:N>.

The N shifting units 422<1:N> in the second pump control signal generation unit 421 and 422<1:N> may level-shift activation levels of the N first pump control signals STG<1:N>, which are transmitted to the N pumping stages 41<1:N>, respectively. The activation levels may be level-shirted to correspond to the level of the second pumping voltage VPUMP2. The level-shifted N first pump control signals STG<1:N> may then be output as the N second pump control signals STGL<1:N>. For example, when the N first pump control signals STG<1:N> have an activation period corresponding to the level of the power source voltage VDD, the N second pump control signals STGL<1:N> may have an activation period corresponding to the level of the second pumping voltage VPUMP2 that is higher than the level of the power source voltage VDD.

The N power source supply units 43<1:N> may supply the power source voltage VDD as N supply voltages VS<1:N> to the N pumping stages 41<1:N>, respectively, in response to respective ones of the N second pump control signals STGL<1:N>. The N power source supply units 43<1:N> may include N NMOS transistors MN<1:N> having drains coupled to power source voltage VDD and sources that supply N supply voltages VS<1:N> to the N pumping stages 41<1:N> in response to the N second pump control signals STGL<1:N> input to respective ones of the gates of the N NMOS transistors MN<1:N>.

Assuming that the N power source supply units 43<1: N> include respective ones of the N NMOS transistors MN<1:N>, each of the N second pump control signals STGL<1:N> having an activation level higher than the level of the power source voltage VDD may be input to the gate stages. Thus, the N power source supply units 43<1:N> may transmit power voltages from drains to sources of their respective transistors. In other words, due to characteristics of an NMOS transistor, the level of the voltage applied to its gate may become a level obtained by combining the level of the voltage transmitted from the drain to the source thereof and a level of a threshold voltage thereof.

Thus, the level of the voltage applied to the gate may be higher than the power source voltage VDD by the level of the threshold voltage, so that the level of the voltage transmitted from the drain to the source thereof may correspond to the level of the power source voltage VDD. In one embodiment, the level of the second pumping voltage VPUMP2 may be higher than the level of the power source voltage VDD by the level of the threshold voltage of the NMOS transistor.

As described above, because the second pump control signal generation unit 421 and 422<1:N> is in the first charge pump block 4, the charge pump circuit illustrated in FIG. 3 may operate differently from the charge pump circuit illustrated in FIG. 1, for example, as described below with reference to FIGS. 9A and 9B.

Figure 9A:
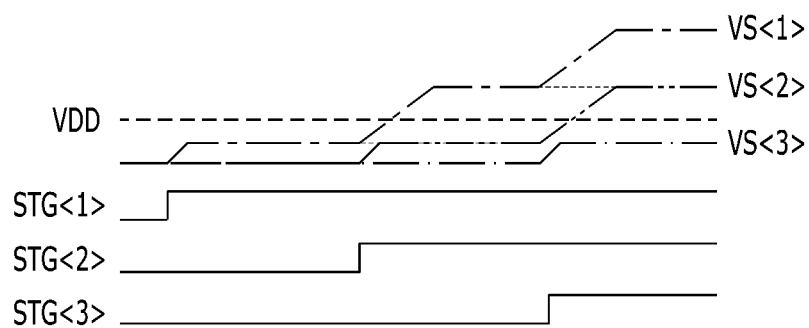
FIGS. 9A, 9B, and 10 illustrates examples of a difference between operation of the charge pump circuit of FIG. 1 and operation of the charge pump circuit of FIG. 3.

FIG. 9A illustrates a case in which the power source voltage VDD is directly supplied to each of the N pumping stages 41<1:N> in the charge pump circuit disclosed in FIG. 1.

Figure 9B:
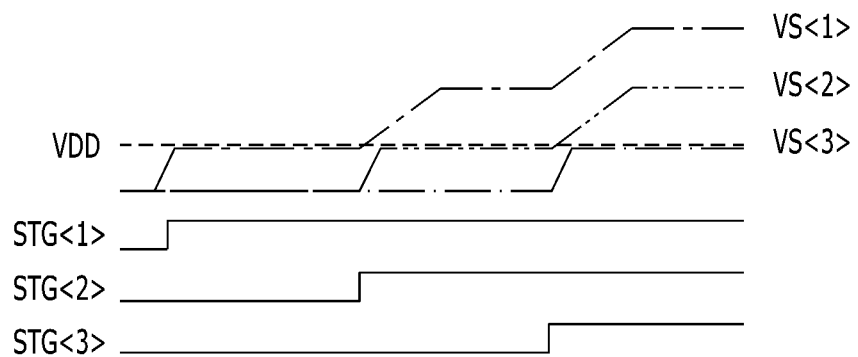

FIG. 9B illustrates a case in which N second pump control signals STGL<1:N> are applied, and the level of the second pumping voltage VPUMP2 is higher than the level of the power source voltage VDD supplied to the N pumping stages 41<1:N>, respectively, in the charge pump circuit disclosed in FIG. 3.

Referring to FIGS. 9A and 9B and assuming in these examples that "N" is 3, when only one control signal STG<1> is activated, a voltage having a level lower than the level of the power source voltage VDD (e.g., by the level of the threshold voltage) may be supplied (VS<1>) to the first pumping stage 11<1>, as shown in FIG. 9A. On the other hand, as shown in FIG. 9B, a voltage having the level of the power source voltage VDD may be supplied (VS<1>) to the first pumping stage 41<1>.

Subsequently, when two control signals STG<1:2> are activated, a voltage having a level lower than the level of the power source voltage VDD by the level of the threshold voltage may be supplied (VS<2>) to the second pumping stage 11<2>, as shown in FIG. 9A. At this time, the first pumping stage 11<1> may perform an operation of doubling the level of the supplied voltage (VS<1>). However, since the level of the supplied voltage is less than the level of the power source voltage VDD, the voltage output from the first pumping stage 11<1> (e.g., the level of the pumping voltage VPUMP) is less than the level of the voltage obtained by doubling the power source voltage VDD.

In FIG. 9B, a voltage having the level of the power source voltage VDD may be supplied (VS<2>) to the second pumping stage 41<2>. In addition, since the level of the supplied voltage to the first pumping stage 41<1> has the level of the power source voltage VDD, the voltage output from the first pumping stage 41<1> (e.g., the first pumping voltage VPUMP1) has a voltage level obtained by doubling the power source voltage VDD.

When three control signals STG<1:3> are activated, a voltage having a level lower than the level of the power source voltage VDD (e.g., by the level of the threshold voltage level) may be supplied (VS<3>) to a third pumping stage 11<3>, in [A]. The first and second pumping stages 11<1:2> may perform an operation of doubling the levels of the supplied voltage (VS<1:2>), respectively. However, since each of the levels of the supplied voltages is lower than the level of the power source voltage VDD, the voltage output from the second pumping stage 11<2> is lower than the level of the voltage obtained by doubling the power source voltage VDD. Also, the voltage output from the first pumping stage 11<1> (e.g., the level of the pumping voltage VPUMP) is lower than the level of the voltage obtained by tripling the power source voltage VDD.

On the other hand, in FIG. 9B, a voltage having the level of the power source voltage VDD may be supplied (VS<3>) to the third pumping stage 41<3>. Since the level of the supplied voltage to the first and second pumping stages 41<1:2>, respectively, has the level of the power source voltage VDD, the voltage output from the second pumping stage 41<2> has the level of the voltage obtained by doubling the power source voltage VDD. Also, the voltage output from the first pumping stage 41<1> (e.g., the first pumping voltage VPUMP1) has the level of the voltage obtained by tripling the power source voltage VDD.

Thus, because the second pump control signal generation unit 421 and 422<1:N> are in the first charge pump block 4, the charge pump circuit of FIG. 3 may more rapidly increase the level of the first pumping voltage VPUMP1 than the charge pump circuit of FIG. 1.

Referring to FIGS. 3 and 5, the voltage comparison block 7 may include a voltage distribution unit (or voltage distributor) 71 and an operation control signal generation unit (or generator) 72. The voltage distribution unit 71 may distribute the level of the first pumping voltage VPUMP1 at a predetermined ratio and may generate a distributed voltage VDIV. For example, the voltage distribution unit 71 may include two resistors R1 and R2 connected in series between a first pumping voltage VPUMP1 stage and a ground voltage VSS stage, and may output a voltage (which is loaded on a node ND1 between the two resistors R1 and R2) as the distributed voltage VDIV. The predetermined ratio may be determined, for example, according to a ratio of resistance values of the two resistors R1 and R2. In one embodiment, the resistance values of the two resistors R1 and R2 may be varied, for example, to be different based on the intended application.

The operation control signal generation unit 72 may include a first voltage comparator CP1, for comparing a level of the distributed voltage VDIV generated by the voltage distribution unit 71 with the pumping reference voltage level VREFP and for determining whether to enable the operation control signal PUMPON according to the comparison result. For example, the operation control signal generation unit 72 may disable the operation control signal PUMPON and output the disabled operation control signal PUMPON when the level of the distributed voltage VDIV generated by the voltage distribution unit 71 is higher than the pumping reference voltage level VREFP. Further, the operation control signal generation unit 72 may enable the operation control signal PUMPON and output the enabled operation control signal PUMPON when the level of the distributed voltage VDIV generated by the voltage distribution unit 71 is lower than the pumping reference voltage level VREFP.

Figure 6:
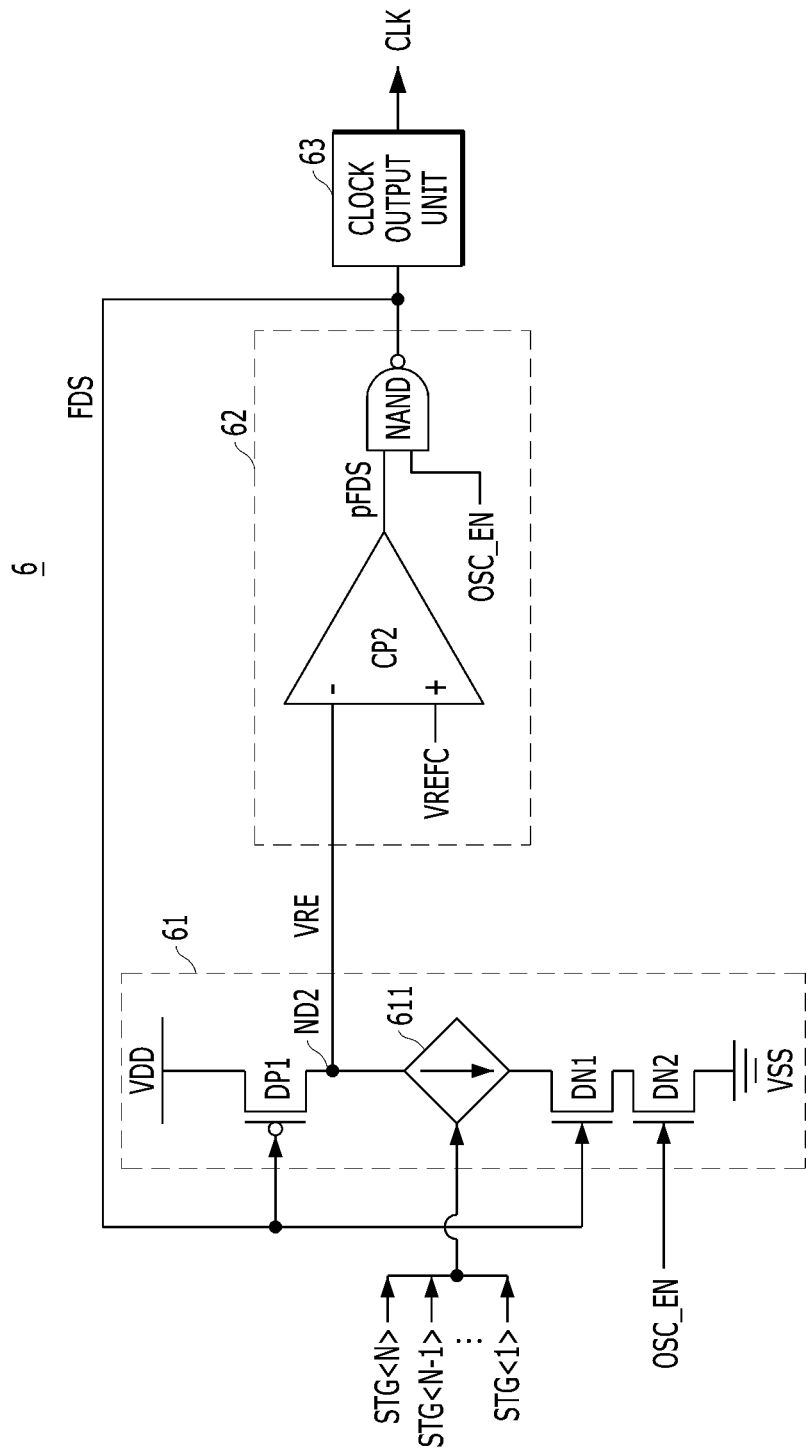
FIG. 6 illustrates an embodiment of a clock generation block.

FIG. 6 is a diagram illustrating an embodiment of the clock generation block (or clock generator) 6 of the charge pump circuit illustrated in FIG. 3.

Referring to FIG. 6, the clock generation block 6 may include a driving operation unit 61, a feedback signal generation unit 62 and a clock output unit 63. The driving operation unit 61 may generate a driving operation voltage VRE in response to the N first pump control signals STG<1:N>, a feedback signal FDS and the clock generation signal OCS_EN. For example, the driving operation unit 61 may increase or decrease the level of the driving operation voltage VRE in response to the feedback signal FDS, and may adjust the speed at which the level of the driving operation voltage VRE decreases according to the number of activated signals among the N first pump control signals STG<1:N>. In addition, the driving operation unit 61 may fix the level of the driving operation voltage VRE to a determined level in response to the clock generation signal OCS_EN.

In one embodiment, the driving operation unit 61 may include a PMOS transistor DP1 connected in series between a power source voltage VDD stage and the ground voltage VSS stage, a current adjusting element 611, a first NMOS transistor DN1 and a second NMOS transistor DN2. A voltage on a node ND2 between the PMOS transistor DP1 and the current adjusting element 611 may be output as the driving operation voltage VRE.

In operation, the PMOS transistor DP1 may on-off control the connection of the power source voltage VDD stage (coupled to a source of the transistor), to a driving operation voltage VRE stage ND2 (coupled to a drain of the transistor) in response to the feedback signal FDS input to a gate of the transistor.

The current adjusting element 611 may adjust the amount of current flowing to a drain of the first NMOS transistor DN1 (coupled to an output thereof) from the driving operation voltage VRE stage ND2 (coupled to an input thereof) in response to the N first pump control signals STG<1:N>. The first NMOS transistor DN1 may on-off control the connection of the output of the current adjusting element 611 (coupled to the drain of the transistor) to a drain of the second NMOS transistor DN2 coupled to a source thereof, in response to the feedback signal FDS applied to a gate thereof. The second NMOS transistor DN2 may on-off control the connection of the source stage of the first NMOS transistor DN1, coupled to the drain thereof, to the ground voltage VSS stage, coupled to a source thereof, in response to the clock generation signal OCS_EN applied to a gate thereof.

As the number of activated signals among the N first pump control signals STG<1:N> is relatively large, the current adjusting element 611 may relatively reduce the amount of current flowing to the drain stage of the first NMOS transistor DN1 from the driving operation voltage VRE stage ND2. Conversely, as the number of activated signals among the N first pump control signals STG<1:N> is relatively small, the current adjusting element 611 may relatively increase the amount of current flowing to the drain stage of the first NMOS transistor DN1 from the driving operation voltage VRE stage ND2.

The feedback signal generation unit 62 may include a second voltage comparator CP2 and a NAND gate. The second voltage comparator CP2 may compare the level of the driving operation voltage VRE (output from the driving operation unit 61) with a driving reference voltage level VREFC, and may determine whether to activate a pre-feedback signal pFDS according to the comparison result. The NAND gate may output the pre-feedback signal pFDS as the feedback signal FDS in response to the clock generation signal OCS_EN.

For example, when the level of the driving operation voltage VRE output from the driving operation unit 61 is lower than the driving reference voltage level VREFC, the feedback signal generation unit 62 may activate the feedback signal FDS to a logic high level and may output the activated feedback signal FDS. Conversely, when the level of the driving operation voltage VRE output from the driving operation unit 61 is higher than the driving reference voltage level VREFC, the feedback signal generation unit 62 may deactivate the feedback signal FDS to a logic low level and may output the deactivated feedback signal FDS.

The clock output unit 63 may output the feedback signal FDS (output from the feedback signal generation unit 62) as the operation clock CLK. For example, the clock output unit 63 may include a flip-flop for transitioning the operation clock CLK in response to a predetermined (e.g., rising) edge of the feedback signal FDS output from the feedback signal generation unit 62.

Figure 7A:
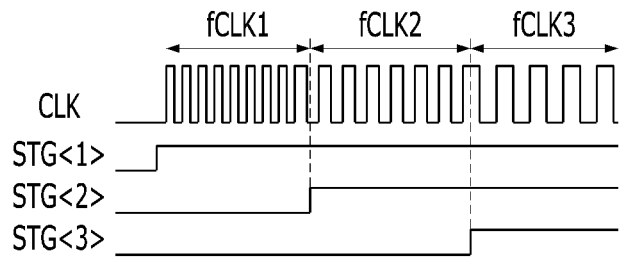
FIGS. 7A to 7C illustrate an example of the operation of the charge pump circuit of FIG. 3.
Figure 7B:
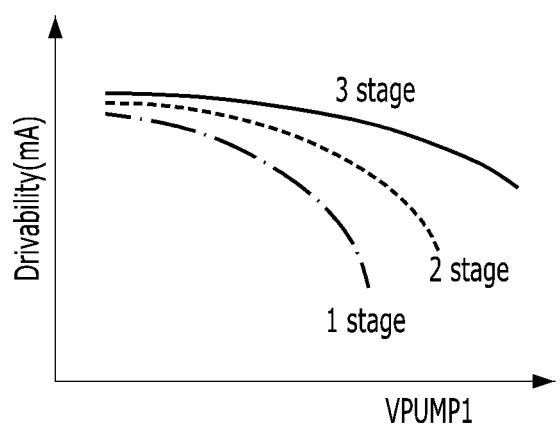
Figure 7C:
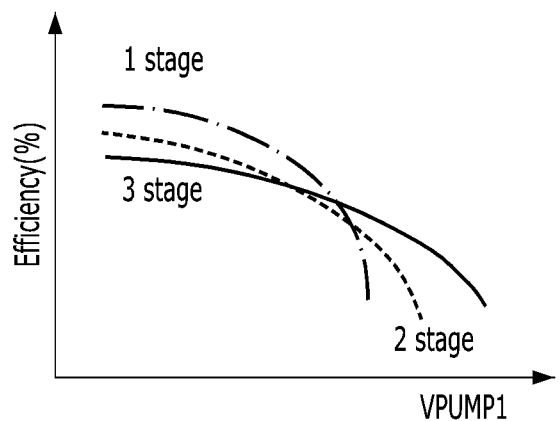

FIGS. 7A to 7C are diagrams illustrating examples of an operation of the charge pump circuit illustrated in FIG. 3.

Referring to FIG. 7A, an operation clock CLK having a relatively high frequency is used while a relatively small number of signals among the N first pump control signals STG<1:N> are activated. An operation clock CLK having a relatively low frequency is used, while a relatively large number of signals among the N first pump control signals STG<1:N> are activated.

Assuming that "N" is 3, it may be seen that a clock fCLK1 having the highest frequency is used as the operation clock CLK, while the first pump control signal STG<1> of the three first pump control signals STG<1:3> is activated. In addition, it may be seen that a clock fCLK3 having the lowest frequency is used as the operation clock CLK, while all of the three first pump control signals STG<1:3> are activated. Moreover, a clock fCLK2 having a relatively medium-sized (or intermediate) frequency is used as the operation clock CLK, while the first and second first pump control signals STG<1:2> among the three first pump control signals STG<1:3> are activated.

Referring to FIG. 7B, the drivability varies depending on the level of the first pumping voltage VPUMP1 generated as a result of the operation of the charge pump circuit and the number of pumping stages used among the N pumping stages 41<1:N> in the first charge pump block 4. For example, when one pumping stage of the N pumping stages 41<1:N> is used (1 stage), the first pumping voltage VPUMP1 having the same level is generated even when relatively lower drivability is used than when two pumping stages thereof are used (2 stage). When two pumping stages of the N pumping stages 41<1:N> are used (2 stage), the first pumping voltage VPUMP1 having the same level is generated even when relatively lower drivability is used than when three pumping stages thereof are used (3 stage).

Referring to FIG. 7C, it may be seen how efficiency varies depending on the level of the first pumping voltage VPUMP1 generated as a result of the operation of the charge pump circuit and the number of pumping stages used among the N pumping stages 41<1:N> in the first charge pump block 4. For example, when the level of the first pumping voltage VPUMP1 is relatively low, a case where two pumping stages of the N pumping stages 41<1:N> are used (2 stage) has higher efficiency than a case where three pumping stages thereof are used (3 stage). Also, a case where one pumping stage thereof is used (1 stage) has higher efficiency than the case where two pumping stages thereof are used (2 stage).

However, as the level of the first pumping voltage VPUMP1 increases, the efficiency decreases more rapidly when one pumping stage of the N pumping stages 41<1:N> is used (1 stage) than when two pumping stages thereof are used (2 stage). Also, the efficiency decreases more rapidly when two pumping stages thereof are used (2 stage) than when three pumping stages thereof are used (3 stage).

Referring to FIGS. 7B and 7C, the level of the first pumping voltage VPUMP1 that can be increased is lower when one pumping stage of the N pumping stages 41<1:N> is used (1 stage) than when two pumping stages thereof are used (2 stage). In addition, the level of the first pumping voltage VPUMP1 that can be increased is lower when two of the N pumping stages 41<1: N> are used (2 stage) than when three pumping stages thereof are used (3 stage). In other words, when the number of pumping stages used among the N pumping stages 41<1:N> is small, the first pumping voltage VPUMP1 may not reach a target level. Therefore, as the target level of the first pumping voltage VPUMP1 becomes higher, the number of used pumping stages may be increased. However, in some cases, it may be desirable to relatively reduce the number of used pumping stages when the target level of the first pumping voltage VPUMP1 is relatively low.

Accordingly, the charge pump circuit illustrated in FIG. 3 may operate using a relatively small number of pumping stages among the N pumping stages 41<1:N> when generating the first pumping voltage VPUMP1 having a level slightly higher than the level of the power source voltage VDD. The charge pump circuit may operate using a relatively large number of pumping stages among the N pumping stages 41<1:N> when generating the first pumping voltage VPUMP1 having a level much higher than the level of the power source voltage VDD.

The following description compares FIGS. 2A and 2B with FIGS. 7B and 7C. According to this comparison, the fluctuation graphs of the drivability when one pumping stage of the N pumping stages 11<1:N> is used (1 stage), two pumping stages are used (2 stage), and three pumping stages are used (3 stage) in FIG. 2A are substantially similar to the fluctuation graphs of the drivability when one pumping stage of the N pumping stages 41<1:N> is used (1 stage), two pumping stages are used (2 stage), and three pumping stages are used (3 stage) in FIG. 7B.

In addition, the fluctuation graphs of the efficiency when one pumping stage of the N pumping stages 11<1:N> is used (1 stage), two pumping stages are used (2 stage), and three pumping stages are used (3 stage) in FIG. 2B are substantially similar to the fluctuation graphs of the efficiency when one pumping stage of the N pumping stages 41<1:N> is used (1 stage), two pumping stages thereof are used (2 stage), and three pumping stages thereof are used (3 stage) in FIG. 7C.

In FIG. 7C, while the level of the first pumping voltage VPUMP1 is relatively low, the operation clock CLK having a relatively high frequency may be used. Also, while the level of the first pumping voltage VPUMP1 is relatively high, the operation clock CLK having a relatively low frequency may be used. On the other hand, in FIG. 2B, the operation clock CLK having an always constant frequency may be used regardless of the level of the pumping voltage VPUMP.

Accordingly, the charge pump circuit of FIG. 3 may have a relatively higher driving speed than the charge pump circuit of FIG. 1, while the level of the first pumping voltage VPUMP1 is relatively low. The charge pump circuit of FIG. 3 may have a relatively lower driving speed than the charge pump circuit of FIG. 1, while the level of the first pumping voltage VPUMP1 is relatively high.

However, since the charge pump circuit of FIG. 3 has relatively high driving speed in a period in which the level of the first pumping voltage VPUMP1 is relatively low, an effect on the overall performance of the charge pump circuit may be reduced or minimized when the charge pump circuit has relatively low driving speed in a period in which the level of the first pumping voltage VPUMP1 is relatively high. In the charge pump circuit of FIG. 3, according to one embodiment the N first pump control signals STG<1:N> may be activated in the same manner as in FIG. 9, e.g., in such a manner that the first pump control signal STG<1> may be activated initially and then the second to $N^{th}$ first pump control signals STG<1:N> may be sequentially activated. Therefore, when the target level of the first pumping voltage VPUMP1 in the charge pump circuit of FIG. 3 is very high, the charge pump circuit may operate to rapidly raise (e.g., at a first rate) the level of the first pumping voltage VPUMP1 initially and then slowly raise (e.g., at a second rate less than the first rate) the level of the first pumping voltage VPUMP1. This may be represented in the graph of FIG. 10 described below. Thus, it may be seen that the level of the first pumping voltage VPUMP1 can reach the target level faster than the charge pump circuit of FIG. 1.

Figure 10:
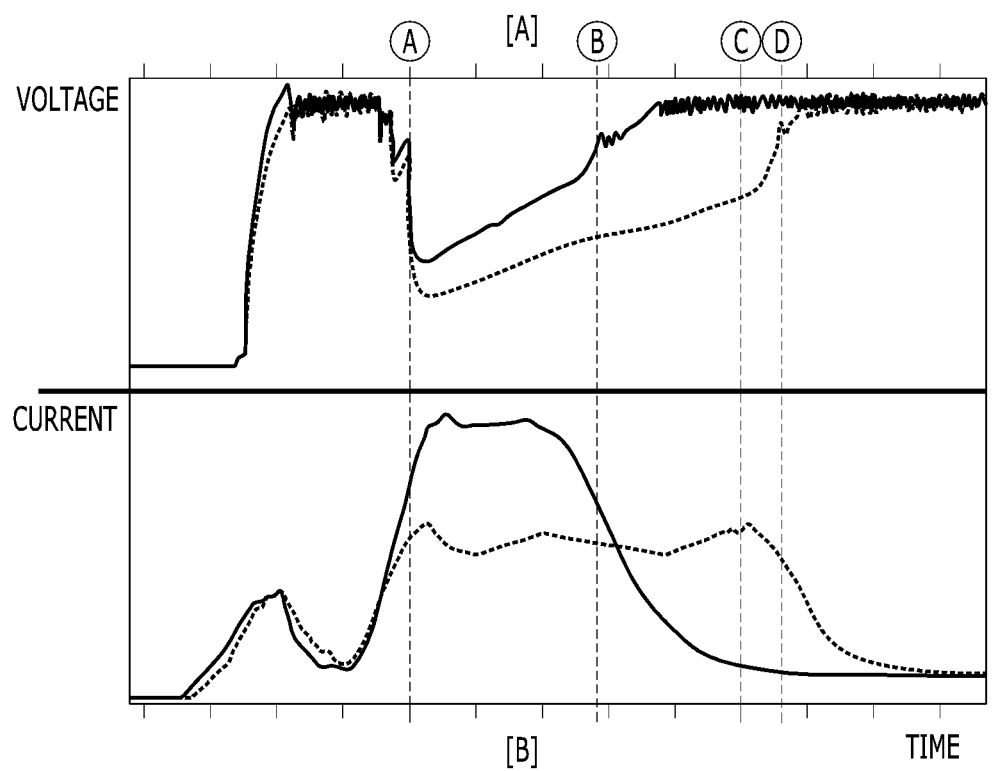

Referring to FIG. 10, it may be seen that the operation of the charge pump circuit of FIG. 1 is indicated by dotted lines, and the operation of the charge pump circuit of FIG. 3 is indicated by solid lines.

Referring to FIG. 10A, an ascending speed of the level of the first pumping voltage VPUMP1 generated by the charge pump circuit of FIG. 3 is greater than the ascending speed of the level of the pumping voltage VPUMP generated by the charge pump circuit of FIG. 1.

Specifically, for the charge pump circuit of FIG. 1, since the frequency of the operation clock CLK is constant all the time, the level of the pumping voltage VPUMP may rise at a first predetermined rate until the time point of "ⓒ", which is the level of the pumping voltage VPUMP has risen to some extent after the time point of "ⓐ". Here, time point "ⓐ" corresponds to the point in time when operation of the charge pump circuit starts. The level of the pumping voltage VPUMP may rise at a second predetermined rate (e.g., which is more rapid or greater than the first predetermined rate) after the time point of "ⓒ", at which the level of the pumping voltage VPUMP has risen to some extent, until it reaches the target level at the time point of "ⓓ".

Thus, it may be seen that, in the case of the charge pump circuit of FIG. 1, since the frequency of the operation clock CLK is constant all the time, the amount of current used from the time point of "ⓐ" to the time point of "ⓓ" does not change significantly and is maintained within a specific range.

In the case of the charge pump circuit of FIG. 3, the frequency of the operation clock CLK may be relatively high initially and then relatively lower later. Therefore, in the case of the charge pump circuit of FIG. 3, the level of the first pumping voltage VPUMP1 may rise at a faster rate than the charge pump circuit of FIG. 1, from time point "ⓐ" at which operation of the charge pump circuit starts. The level of the first pumping voltage VPUMP1 may continue to rise at a similar rate after time point "ⓑ", at which the level of the first pumping voltage VPUMP1 has risen to some extent, until it reaches the target level.

Thus, in the case of the charge pump circuit of FIG. 3, the amount of current, used from time point "ⓐ" to time point "ⓑ" at which the frequency of the operation clock CLK is relatively high, increases very significantly. As a result, the level of the first pumping voltage VPUMP1 may increase relatively rapidly, and the amount of current, used after time point "ⓑ" at which the frequency of the operation clock CLK is relatively lowered, decreases significantly. As a result, the level of the first pumping voltage VPUMP1 may be relatively slowly increased.

At this time, in the case of the charge pump circuit of FIG. 3, since the level of the first pumping voltage VPUMP1 has already been greatly increased from time point of "ⓐ" to time point "ⓑ", the first pumping voltage VPUMP1 may reach the target level more rapidly than the charge pump circuit of FIG. 1, even though the level increase speed of the first pumping voltage VPUMP1 decreases after time point "ⓑ".

In addition, in the case of the charge pump circuit of FIG. 3, the amount of current used from time point "ⓐ" to time point "ⓑ" may increase very significantly, and thus more current may be consumed than in the charge pump circuit of FIG. 1. However, since the amount of current used after time point "ⓑ" is greatly reduced, less current may be consumed than in the charge pump circuit of FIG. 1. In other words, it may be seen that the total amount of current used to reach the target level of the first pumping voltage VPUMP1 in the charge pump circuit of FIG. 3 and the total amount of current used to reach the target level of the pumping voltage VPUMP in the charge pump circuit of FIG. 1 may be almost the same.

Figure 11:
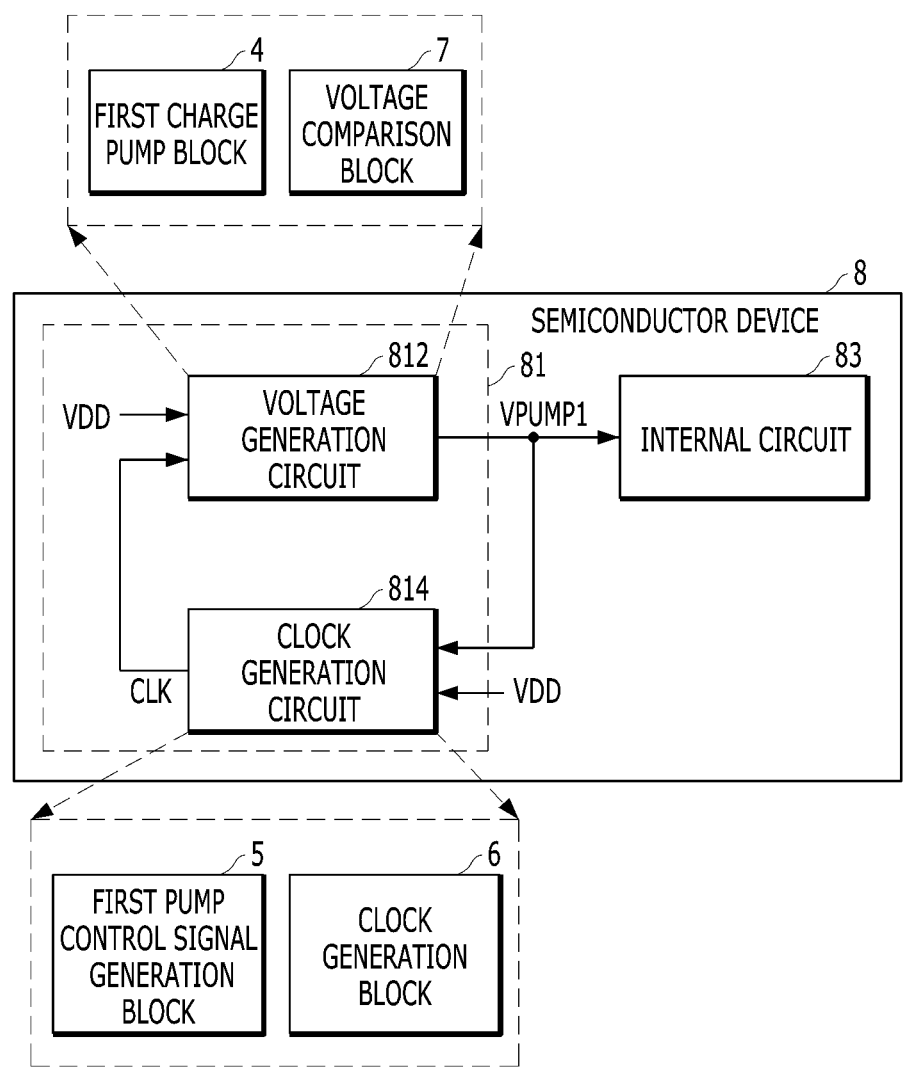
FIG. 11 illustrates an embodiment of a semiconductor device.

FIG. 11 is a diagram illustrating an embodiment of a semiconductor device 8 including the charge pump circuit of FIG. 3, now labeled by reference numeral 81.

Referring to FIG. 11, the semiconductor device 8 may include the charge pump circuit 81 and an internal circuit 83. The charge pump circuit 81 may include a voltage generation circuit 812 and a clock generation circuit 814.

The charge pump circuit 81 included in the semiconductor device 8 may generate a first pumping voltage VPUMP1 in response to an operation clock CLK. The charge pump circuit 81 may generate the first pumping voltage VPUMP1 using the operation clock CLK, having a relatively high frequency during an initial operation period in which a level of the first pumping voltage VPUMP1 is relatively low and having a relatively low frequency in response to a rise in the level of the first pumping voltage VPUMP1 after the initial operation period.

In one embodiment, the voltage generation circuit 812 in the charge pump circuit 81 may pump a power source voltage VDD in response to the operation clock CLK to generate the first pumping voltage VPUMP1. The clock generation circuit 814 in the charge pump circuit 81 may generate the operation clock CLK, having a relatively high frequency during the initial operation period in which the level of the first pumping voltage VPUMP1 generated by the voltage generation circuit 812 is relatively low. The clock generation circuit 814 may then generate the operation clock CLK by relatively lowering the frequency of the operation clock CLK, in response to the increase in the level of the first pumping voltage VPUMP1 after the initial operation period.

The clock generation circuit 814 may include a first pump control signal generation block 5 and a clock generation block 6, which, for example, may correspond to those discussed with reference to FIGS. 3 to 10. Likewise, the voltage generation circuit 812 may include a first charge pump block 4 and a voltage comparison block 7, which, for example, may correspond to those described with reference to FIGS. 3 to 10. In other words, the same reference numerals used in FIGS. 3 to 10 are applied to the first charge pump block 4, the voltage comparison block 7, the first pump control signal generation block 5 and the clock generation block 6 illustrated in FIG. 11, and the operations thereof may be the same as well.

The internal circuit 83 in the semiconductor device 8 may perform a predetermined internal operation in response to the first pumping voltage VPUMP1. For example, when the semiconductor device 8 is a memory device (e.g., a non-volatile memory device), the internal circuit 83 may include a word line driver that operates using a high voltage.

In accordance with one embodiment, an apparatus includes a storage area and one or more processors. The storage area may be, for example, any area within a non-transitory computer-readable medium, which may correspond to any area in a volatile or non-volatile memory. The storage area may store instructions for execution by the one or more processors. The one or more processors may correspond to any of the signal processor or signal generating elements of the embodiments described herein, including any of the signal generators, clock generators, comparators, shifters, and/or any of the other elements of the disclosed embodiments.

When the instructions in the storage area are executed by the one or more processors, the one or more processors may perform the operations in accordance with the embodiments described herein. For example, but not by way of limitation, the one or more processors may execute the instructions to control generation of different combinations of control signals to selectively activate different combinations of pumping stages of the aforementioned charge pump circuit based on an operation clock. In one embodiment, the one or more processors may output a pumping voltage based on one of the different combinations of control signals.

In addition, the one or more processors may execute the instructions to set the operation clock to a first frequency based on activation of a first number of the control signals, and set the operation clock to have a second frequency based on activation of the second number of the control signals, wherein the second frequency is higher than the first frequency.

In addition, the one or more processors may execute the instructions to activate a first number of signals to raise the first pumping voltage to a level higher than a level of the power source voltage by a first amount, activate a second number of signals to raise the level of the first pumping voltage to be higher than the level of the power source voltage by a second amount, the first number of signals being greater than the second number of signals and the first amount being greater than the second amount.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods herein.

When implemented in at least partially in software, the controllers, processors, devices, modules, blocks, shifters, stages, comparators, internal circuits, units, multiplexers, generators, logic, interfaces, decoders, drivers, generators and other signal generating and signal processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

In accordance with one or more of the aforementioned embodiments, a charge pump circuit may generate a pumping voltage having a higher level than a power source voltage, and may operate using a clock whose frequency is variable depending on a level of the pumping voltage.

Also, the charge pump circuit may operate using a clock signal (having a relatively high frequency when the level of the pumping voltage is relatively lower than a level of the power source voltage) and a clock signal (having a relatively low when the level of the pumping voltage is relatively higher than the level of the power source voltage).

Accordingly, the area occupied by the charge pump circuit may be reduced, while at the same time producing a significant increase in operation efficiency and pumping drivability of the charge pump circuit.

While the present disclosure has been illustrated and described with respect to specific embodiments and drawings, the disclosed embodiments are not intended to be restrictive. Further, it is noted that the present disclosure may be achieved in various ways through substitution, change, and modification, as those skilled in the art will recognize in light of the present disclosure, without departing from the spirit and/or scope of the present disclosure. For example, dispositions and types of the logic gates and transistors described in the aforementioned embodiments may be implemented differently based on the polarity of an inputted signal. The embodiments may be combined to form additional embodiments.

What is claimed is:

1. A charge pump circuit, comprising:
    a first charge pump suitable to generate a first pumping voltage using a power source voltage in response to an operation clock, the first charge pump including N pumping stages configured to operate based on N second pump control signals having a same activation period as N first pump control signals but having higher activation levels than the N first pump control signals, respectively, where N is a natural number equal to or greater than 2;
    a first pump control signal generator suitable to activate a first number of signals among the N first pump control signals to raise the first pumping voltage to a level higher than a level of the power source voltage by a first amount, and to activate a second number of signals among the N first pump control signals to raise the level of the first pumping voltage to be higher than the level of the power source voltage by a second amount, the first number of signals being greater than the second number of signals and the first amount being greater than the second amount; and
    a clock generator suitable to change a frequency of the operation clock based on whether the number of activated signals corresponds to the first number of signals or the second number of signals, the clock generator suitable to:
    generate the operation clock having a first frequency based on activation of the first number of signals, and
    generate the operation clock having a second frequency based on activation of the second number of signals, wherein the second frequency is higher than the first frequency.

2. The charge pump circuit of claim 1, wherein the first charge pump comprises:
    a second pump control signal generator suitable to generate the N second pump control signals in response to the N first pump control signals; and
    N power source supplies suitable to supply the power source voltage as operating power of the N pumping stages in response to the N second pump control signals, respectively.

3. The charge pump circuit of claim 2, wherein the second pump control signal generator comprises:
    a second charge pump suitable to pump the power source voltage to generate a second pumping voltage in response to the operation clock; and
    N shifters suitable to level-shift activation levels of the N first pump control signals to a level of the second pumping voltage, and to output the level-shifted N first pump control signals as the N second pump control signals.

4. The charge pump circuit of claim 3, wherein the N power source supplies comprise N NMOS transistors suitable to selectively supply the power source voltage to respective ones of the N pumping stages in response to respective ones of the N second pump control signals.

5. The charge pump circuit of claim 1, wherein the first pump control signal generator:
    activates the N first pump control signals in a predetermined order, and
    deactivates the N first pump control signals in a reverse order of the predetermined order.

6. The charge pump circuit of claim 1, further comprising:
    a voltage comparator suitable to compare the level of the first pumping voltage with a pumping reference voltage level and to generate an operation control signal,
    wherein the first charge pump comprises a pumping controller suitable to on-off control an operation of each of the N pumping stages in response to at least one of the N first pump control signals, the operation clock, or the operation control signal.

7. The charge pump circuit of claim 1, wherein the clock generator comprises:
    a driving operator suitable to increase or decrease a level of a driving operation voltage in response to a feedback signal, and to adjust a speed at which the level of the driving operation voltage decreases, depending on activation of the first number or the second number of signals among the N first pump control signals;
    a feedback signal generator suitable to compare the level of the driving operation voltage with a driving reference voltage level, and to determine whether to activate the feedback signal according to a result of the comparison result; and a clock output suitable to output the feedback signal as the operation clock, wherein the driving operator suitable to:

decrease a speed at which the level of the driving operation voltage decreases when the number of activated signals among the N first pump control signals is increases, and increase the speed at which the level of the driving operation voltage decreases when the number of activated signals among the N first pump control signals decreases.

8. A semiconductor device, comprising:

a voltage generator suitable to pump a power source voltage in response to an operation clock and a control signal having higher activation levels than the power source voltage to generate a first pumping voltage;

a clock generator suitable to generate the operation clock having a first frequency during an initial operation period in which a level of the first pumping voltage is at a first level and to generate the operation clock having a second frequency after the initial operation period, the second frequency generated to be lower than the first frequency in response to a rise in a level of the first pumping voltage to a second level greater than the first level; and an internal circuit suitable to perform a predetermined internal operation in response to the first pumping voltage.

9. The semiconductor device of claim 8, wherein the clock generator comprises:

a first pump control signal generator suitable to activate a first number of signals among N first pump control signals to raise the level of the first pumping voltage to be higher than a level of the power source voltage by a first amount, and to activate a second number of signals among the N first pump control signals to raise the level of the first pumping voltage to be higher than the level of the power source voltage by a second amount, the first number of signals greater than the second number of signals and the first amount greater than the second amount; and a clock generator suitable to reduce the frequency of the operation clock as the number of activated signals among the N first pump control signals increases, and to increase the frequency of the operation clock as the number of activated signals among the N first pump control signals decreases, where N is a natural number equal to or greater than 2.

10. The semiconductor device of claim 9, wherein the voltage generator comprises:

a first charge pump suitable to generate a first pumping voltage using the power source voltage in response to the operation clock, the first charge pump including N pumping stages which are activated in response to N first pump control signals, respectively.

11. The semiconductor device of claim 10, wherein the first charge pump comprises:

a second pump control signal generator suitable to generate N second pump control signals having a same activation period as the N first pump control signals but having higher activation levels than the N first pump control signals; and N power source supplies suitable to supply the power source voltage as operating power of the N pumping stages in response to the N second pump control signals, respectively.

12. The semiconductor device of claim 11, wherein the second pump control signal generator comprises:

a second charge pump suitable to pump the power source voltage to generate a second pumping voltage in response to the operation clock; and N shifters suitable to level-shift activation levels of the N first pump control signals to a level of the second pumping voltage, and to output the level-shifted N first pump control signals as the N second pump control signals.

13. The semiconductor device of claim 12, wherein the N power source supplies comprise N NMOS transistors suitable to selectively supply the power source voltage to respective ones of the N pumping stages in response to respective ones of the N second pump control signals.

14. The semiconductor device of claim 9, wherein the first pump control signal generator:

activates the N first pump control signals in a predetermined order, and deactivates the N first pump control signals in a reverse order of the predetermined order.

15. The semiconductor device of claim 10, wherein the voltage generator comprises:

a voltage comparator suitable to compare the level of the first pumping voltage with a pumping reference voltage level and to generate an operation control signal, the first charge pump block comprising a pumping controller suitable to on-off control an operation of each of the N pumping stages in response to at least one of the N first pump control signals, the operation clock or the operation control signal.

16. The semiconductor device of claim 9, wherein the clock generator comprises:

a driving operator suitable to increase or decrease a level of a driving operation voltage in response to a feedback signal, and adjust a speed at which the level of the driving operation voltage decreases depending on the number of activated signals among the N first pump control signals;

a feedback signal generator suitable to compare the level of the driving operation voltage with a driving reference voltage level and to determine whether to activate the feedback signal according to a result of the comparison; and a clock output suitable to output the feedback signal as the operation clock, wherein the driving operator:

decreases the speed at which the level of the driving operation voltage decreases when the number of activated signals among the N first pump control signals is in a first range, and increase the speed at which the level of the driving operation voltage when the number of activated signals among the N first pump control signals is in a second range less than the first range.

17. An operating method of a charge pump circuit that generates a first pumping voltage using a power source voltage in response to an operation clock, the charge pump circuit including N pumping stages having operations determined in response to respective ones of N second pump control signals having a same activation period as N first pump control signals and having higher activation levels than the N first pump control signals, wherein N is a natural number equal to or greater than 2, the operating method comprising:

activating a first number of signals among the N first pump control signals to raise a level of the first pumping voltage to be higher than a level of the power source voltage by a first amount, and activating a second number of signals among the N first pump control signals to raise the level of the first pumping voltage to be higher than the level of the power source voltage by a second amount, the first number of signals being greater than the second number of signals and the first amount being greater than the second amount;

generating the operation clock having a first frequency based on activation of the first number of signals; and generating the operation clock having a second frequency based on activation of the second number of signals, wherein the first frequency is lower than the second frequency.

18. The operating method of claim 17, further comprising:

generating the N second pump control signals in response to the N first pump control signals; and supplying the power source voltage as operating power of the N pumping stages in response to the N second pump control signals, respectively.

19. The operating method of claim 18, wherein generating the N second pump control signals comprises:

pumping the power source voltage to generate a second pumping voltage in response to the operation clock; and level-shifting activation levels of the N first pump control signals to a level of the second pumping voltage, and output the level-shifted N first pump control signals as the N second pump control signals.

20. The operating method of claim 17, wherein the N first pump control signals are activated in a predetermined order and deactivated in a reverse order of the predetermined order.

* * * * *